(12) United States Patent
Toyonaka et al.

(10) Patent No.: US 10,978,605 B2
(45) Date of Patent: Apr. 13, 2021

(54) SEMICONDUCTOR PHOTODIODE, OPTICAL RECEIVER MODULE, OPTICAL MODULE, AND OPTICAL TRANSMISSION EQUIPMENT

(71) Applicant: Lumentum Japan, Inc., Kanagawa (JP)

(72) Inventors: Takashi Toyonaka, Kanagawa (JP); Hiroshi Hamada, Kanagawa (JP); Shigehisa Tanaka, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 35 days.

(21) Appl. No.: 16/296,492

(22) Filed: Mar. 8, 2019

(65) Prior Publication Data

US 2019/0280147 A1    Sep. 12, 2019

(30) Foreign Application Priority Data

Mar. 9, 2018  (JP) .............................. JP2018-042679

(51) Int. Cl.
*H01L 31/103*  (2006.01)
*H01L 31/0288*  (2006.01)
*H01L 31/0232*  (2014.01)

(52) U.S. Cl.
CPC ...... *H01L 31/1035* (2013.01); *H01L 31/0288* (2013.01); *H01L 31/0232* (2013.01)

(58) Field of Classification Search
None
See application file for complete search history.

(56) References Cited

U.S. PATENT DOCUMENTS 6,740,908 B1 * 5/2004 Giboney ......... H01L 31/022408
257/185
2005/0001239 A1    1/2005 Ishibashi et al.

FOREIGN PATENT DOCUMENTS

JP    2003-174184 A    6/2003

OTHER PUBLICATIONS

T. Ohno, et al., "25-Gbit/s Receiver Optical Subassembly Using Maximized-Induced-Current Photodiode", PRM2010 (2010International Conference on Indium Phosphide and Related Materials) Paper ThA2-4, Jun. 3, 2010.

* cited by examiner

*Primary Examiner* — Grant S Withers
(74) *Attorney, Agent, or Firm* — Hamty & Hamty, LLP (57) ABSTRACT

Provided are a semiconductor photodiode which achieves a higher response rate in a state in which light receiving sensitivity is maintained. The semiconductor photodiode includes a p-type semiconductor contact layer, an n-type semiconductor contact layer, and a light absorption layer. The light absorption layer includes a first semiconductor absorption layer having a thickness Wd and a p-type second semiconductor absorption layer having a thickness Wp. The first semiconductor absorption layer and the second absorption layer are made of the same composition. The first semiconductor absorption layer is depleted, and the second semiconductor absorption layer maintains an electric charge neutral condition except for a region near an interface with the first semiconductor absorption layer. A relationship between the thickness Wd and the thickness Wp satisfies $0.47 \leq Wp/(Wp+Wd) \leq 0.9$.

20 Claims, 9 Drawing Sheets

SEMICONDUCTOR PHOTODIODE, OPTICAL RECEIVER MODULE, OPTICAL MODULE, AND OPTICAL TRANSMISSION EQUIPMENT

CROSS-REFERENCE TO RELATED APPLICATION

The present application claims priority from Japanese application JP2018-042679 filed on Mar. 9, 2018, the content of which is hereby incorporated by reference into this application.

BACKGROUND OF THE INVENTION

1. Field of the Invention

The present invention relates to a semiconductor photodiode, an optical receiver module, an optical module, and an optical transmission equipment, and particularly, to a technology for improving high frequency characteristics.

2. Description of the Related Art

In general, in a semiconductor photodiode, a light absorption layer which absorbs input light is disposed between a p-type contact layer connected to a p-type electrode and an n-type contact layer connected to an n-type electrode.

Patent Literature 1 (JP2003-174184A) discloses a photodiode having a structure which enhances a response rate while maintaining light receiving sensitivity at a constant level and having a light absorption layer constituted by a p-type absorption layer and an undoped absorption layer. The invention described in Patent Literature 1 describes a calculation method of a ratio of the p-type absorption layer for maximizing the response rate and an expected response rate in a condition in which a total thickness of the p-type absorption layer and the undoped absorption layer is constant in order to secure desired light receiving sensitivity.

Non-Patent Literature 1 (IPRM 2010, Paper ThA2-4) reports an example of a structure design and an evaluation result of a prototype to be used in a technology related to Patent Literature 1.

SUMMARY OF THE INVENTION

In a case where the ratio of the p-type absorption layer is calculated by using the calculation method described in Patent Literature 1, the ratio of the p-type absorption layer for maximizing the response rate while maintaining the light receiving sensitivity at the constant level is 45%, and is 35% in the example described in Non-patent Literature 1.

In the calculation method described in Patent Literature 1 and Non-Patent Literature 1, it is assumed that electrons generated in the p-type absorption layer are drifted to the undoped absorption layer through diffusion and thus, an effective carrier transit time $T_A$ of the p-type absorption layer is defined. The carrier transit time $T_A$ is calculated by using the fact that a general diffusion coefficient $D_e$ of the electrons is 200 cm$^2$/s.

However, the inventors have acquired the following knowledge as a result of intensive studies. The electrons generated in the p-type absorption layer are not simply drifted by a diffusion model. Of the electrons and holes generated in the undoped absorption layer, since the electrons reach the n-type electrode within a short time, the holes remain within the undoped absorption layer. The electrons of the p-type absorption layer reach the inside of the undoped absorption layer at a velocity higher than a drift velocity calculated from the general diffusion coefficient $D_e$ of the electrons by an internal electric field generated between the holes remaining within the undoped absorption layer and the electrons of the p-type absorption layer. Thus, it is considered that the ratio of the p-type absorption layer for maximizing the response rate is larger than the value represented in Patent Literature 1 and Non-Patent Literature 1.

In Patent Literature 1 and Non-Patent Literature 1, it is assumed that a drift velocity $V_h$ of the holes of the undoped absorption layer is a constant value. This is based on the assumption that the drift velocity of the holes is a saturation velocity (5×10$^6$ cm/s). However, in a case where a reverse bias voltage is low, the undoped absorption layer becomes thick, and thus, electric field intensity is decreased. Accordingly, since the drift velocity of the hole is slower than the saturation velocity, there is a problem that the calculation result is more inaccurate.

The present invention has been made in view of such a problem, and an object of the present invention is to provide a semiconductor photodiode, an optical receiver module, an optical module, and an optical transmission equipment which achieve a higher response rate in a state in which light receiving sensitivity is maintained.

(1) In order to solve the problems, a semiconductor photodiode includes a p-type electrode, a p-type semiconductor contact layer connected to the p-type electrode, an n-type electrode, an n-type semiconductor contact layer connected to the n-type electrode, and a light absorption layer disposed between the p-type semiconductor contact layer and the n-type semiconductor contact layer. The light absorption layer includes a first semiconductor absorption layer which is disposed on a side of the n-type semiconductor contact layer and has a thickness Wd, and a second semiconductor absorption layer which is in contact with the first semiconductor absorption layer, is disposed on a side of the p-type semiconductor contact layer, has a thickness Wp, and is doped in a p-type. The first semiconductor absorption layer and the second semiconductor absorption layer are made of the same composition, and the first semiconductor absorption layer has bandgap energy in which input light is absorbed. In a case where a predetermined reverse bias voltage is applied between the p-type electrode and the n-type electrode, the first semiconductor absorption layer is depleted, and the second semiconductor absorption layer maintains an electric charge neutral condition except for a region near an interface with the first semiconductor absorption layer. A relationship between the thickness Wd and the thickness Wp satisfies 0.47≤Wp/(Wp+Wd)≤0.9.

(2) In the semiconductor photodiode according to (1), the first semiconductor absorption layer may be in contact with the n-type semiconductor contact layer, the second semiconductor absorption layer may be in contact with the p-type semiconductor contact layer, and the relationship between the thickness Wd and the thickness Wp may satisfy 0.47≤Wp/(Wp+Wd)≤0.85.

(3) The semiconductor photodiode according to (1) may further include a semiconductor electron transit layer disposed between the first semiconductor absorption layer and the n-type semiconductor contact layer. The semiconductor electron transit layer may have bandgap energy which is higher than the bandgap energy in which the input light is absorbed and does not function as the light absorption layer. In a case where the predetermined reverse bias voltage is applied between the p-type electrode and the n-type electrode, the semiconductor electron transit layer may be depleted. The relationship between the thickness Wd and the thickness Wp satisfies $0.5 \leq Wp/(Wp+Wd) \leq 0.88$.

(4) The semiconductor photodiode according to (3) may further include a semiconductor field control layer which is disposed between the first semiconductor absorption layer and the semiconductor electron transit layer and to which impurities having a doping concentration higher than both a doping concentration of the first semiconductor absorption layer and a doping concentration of the semiconductor electron transit layer are added.

(5) In the semiconductor photodiode according to any one of (1) to (4), the semiconductor photodiode may have a semiconductor multilayer structure constituted by a group III compound semiconductor and a group V compound semiconductor.

(6) In the semiconductor photodiode according to any one of (1) to (4), both the first semiconductor absorption layer and the second semiconductor absorption layer may be made of one composition selected from a group consisting of InGaAs, InGaAsP, and InAlGaAs.

(7) An optical receiver module according to the present invention may include the semiconductor photodiode according to any one of (1) to (6).

(8) An optical module according to the present invention may include the optical receiver module according to (7), and an optical transmitter module.

(9) An optical transmission equipment according to the present invention may have the optical module according to (8) mounted thereon.

According to the present invention, there are provided a semiconductor photodiode, an optical receiver module, an optical module, and an optical transmission equipment which achieve a higher response rate in a state in which light receiving sensitivity is maintained.

DETAILED DESCRIPTION OF THE INVENTION

Hereinafter, embodiments of the present invention will be described specifically and in detail with reference to the drawings. In all the drawings for describing the embodiments, the same reference numerals are given to the members having the same function, and the repeated description thereof will be omitted. The drawings illustrated below merely illustrate examples of the embodiments, and the sizes of the drawings and the scales described in the embodiments do not necessarily coincide with each other.

First Embodiment

Figure 1:
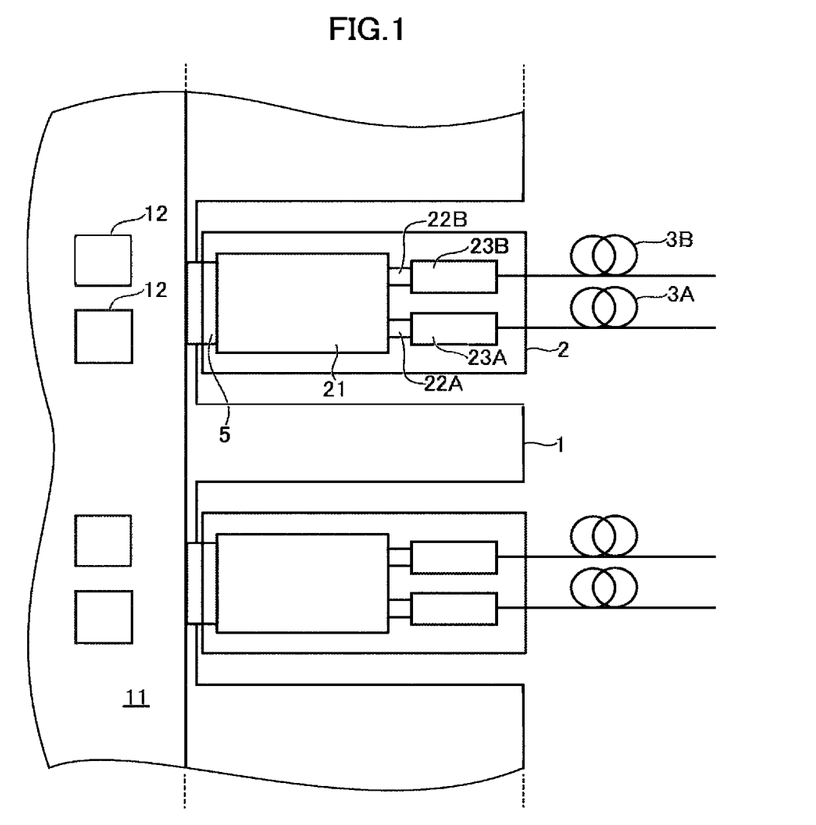
FIG. 1 is a schematic view illustrating a configuration of an optical transmission equipment and an optical module according to a first embodiment of the present invention.

FIG. 1 is a schematic view illustrating a configuration of an optical transmission equipment 1 and an optical module 2 according to a first embodiment of the present invention. The optical transmission equipment 1 includes a printed circuit board 11 (PCB) and an IC 12. The optical transmission equipment 1 is, for example, a large-capacity router or a switch. The optical transmission equipment 1 has, for example, a function of a switching equipment, and is disposed in a base station or the like. A plurality of optical modules 2 are mounted in the optical transmission equipment 1. The optical transmission equipment 1 acquires data for receiving (electric signal for receiving) from the optical module 2, determines to transmit what data to where using the IC 12 or the like, generates data for transmitting (electric signal for transmitting), and transmits the data to the corresponding optical module 2 through the printed circuit board 11.

The optical module 2 is a transceiver having a function of optical transmitting and a function of optical receiving. The optical module 2 includes a printed circuit board 21, an optical receiver module 23A which converts an optical signal received through an optical fiber 3A into an electric signal, and an optical transmitter module 23B which converts an electric signal into an optical signal and transmits the optical signal to an optical fiber 3B. The printed circuit board 21 is connected to the optical receiver module 23A and the optical transmitter module 23B through flexible printed circuits 22A and 22B (FPC), respectively. An electric signal is transmitted from the optical receiver module 23A to the printed circuit board 21 through the flexible printed circuits 22A, and an electric signal is transmitted from the printed circuit board 21 to the optical transmitter module 23B through the flexible printed circuits 22B. The optical modules 2 and the optical transmission equipment 1 are connected to each other through electrical connectors 5. The optical receiver module 23A and the optical transmitter module 23B are electrically connected to the printed circuit board 21 and convert an optical/electric signal into an electric/optical signal. The printed circuit board 21 includes a control circuit (for example, an IC) to control the electric signal transmitted from the optical receiver module 23A, and a control circuit (for example, an IC) to control the electric signal transmitting to the optical transmitter module 23B.

A transmission system according to the first embodiment includes two or more of the optical transmission equipments 1, two or more of the optical modules 2, and one or more of optical fibers 3 (not shown in FIG. 1: for example, the optical fibers 3A and 3B). One or more of the optical modules 2 are connected to each optical transmission equipment 1. The optical fiber 3 is connected between the optical modules 2 mounted on the two optical transmission equipments 1, respectively. Transmitting data generated by one of the two optical transmission equipments 1 is converted into an optical signal by the mounted optical module 2, and such an optical signal is transmitted to the optical fiber 3. The optical signal transmitted over the optical fiber 3 is received by the optical module 2 mounted on the other of the two optical transmission equipments 1, and the optical module converts the optical signal into an electric signal and transmits the electric signal to the other of the two optical transmission equipments 1 as receiving data.

Figure 2:
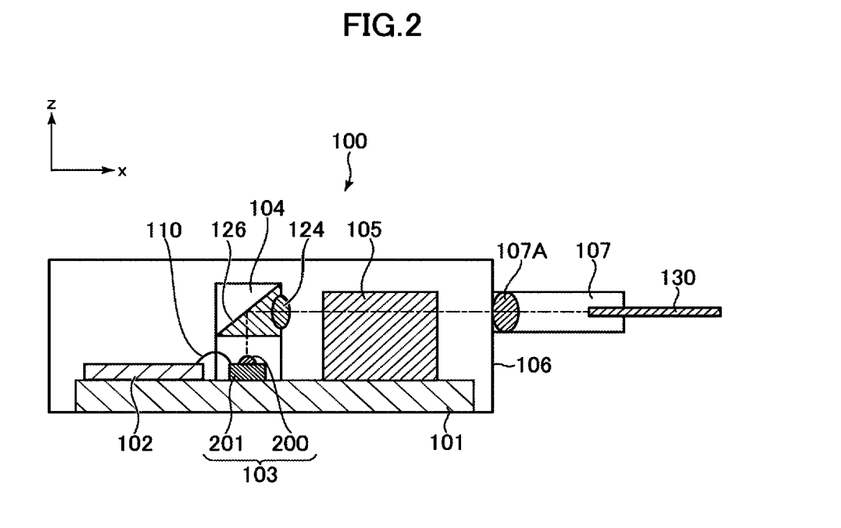
FIG. 2 is a schematic diagram showing a structure of an optical receiver module according to the first embodiment of the present invention.

FIG. 2 is a schematic diagram showing a structure of an optical receiver module 100 according to the first embodiment. The optical receiver module 100 according to the first embodiment is the optical receiver module 23A shown in FIG. 1. The optical receiver module 100 is a 200 Gbit/s class four-channel receiver optical subassembly (ROSA) (each channel has a bit rate of 50 Gbit/s class). The optical receiver module 100 includes a metal substrate 101 (supporting substrate), an IC 102, a photo detector (PD) device 103, a microlens array 104, an optical demultiplexing circuit 105, a box-shaped casing 106, and a connection portion 107 including a collimator lens 107A. The metal substrate 101 is disposed on a bottom surface inside the box-shaped casing 106. The IC 102, the PD device 103, the microlens array 104, and the optical demultiplexing circuit 105 are disposed on a front surface of the metal substrate 101. The connection portion 107 is disposed on a side surface of the box-shaped casing 106. FIG. 2 shows a cross section taken along an xz plane of the optical receiver module 100. In this example, an x-axis direction is parallel to an orientation (−x-axis direction) of light incident from the connection portion 107, and a z-axis direction is a direction perpendicular to the front surface of the metal substrate 101. A plurality of terminals of the IC 102 and a plurality of terminals of the PD device 103 are connected by the corresponding wires 110, respectively.

The PD device 103 includes four pin photodiodes 200 and a submount 201. The photodiodes 200 are disposed along an end portion of the IC 102. A light receiving window is disposed at a top portion (corresponding to a rear surface of the element) of each photodiode 200, and the photodiode 200 converts an optical signal incident on the light receiving window into an electric signal. The submount 201 is formed by a ceramic substrate (for example, an AlN substrate) having an electrode pattern disposed on a front surface. The four photodiodes 200 are disposed on an upper surface of the submount 201. Although it has been described in the first embodiment that the light receiving window has a lens structure, the present invention is not limited thereto.

The microlens array 104 includes a lens main body and two piers supporting the lens main body from both sides. The lens main body of the microlens array 104 is configured such that four lenses 124 disposed in a y-axis direction are disposed on a front rising surface. Each lens 124 is a convex lens that collects light incident on the lens 124 from the front. An antireflection film is disposed so as to surround the four lenses 124. The y-axis direction is a direction perpendicular to both an x-axis and a z-axis, and is a direction perpendicularly penetrating the paper surface of FIG. 2.

A mirror 126 is disposed on an upper surface of the lens main body of the microlens array 104. The mirror 126 reflects the collected light by the lens 124, and collects the reflected light on the light receiving window of the corresponding photodiode 200. It is preferable that a focal point of light collected by each lens 124 is positioned in the light receiving window of the corresponding photodiode 200 or an absorption layer within the photodiode 200, but the position of the focal point may be selected as needed.

The connection portion 107 includes the collimator lens 107A, and an optical fiber 130 is connected to the connection portion 107. Light incident on the inside of the box-shaped casing 106 of the optical receiver module 100 from the optical fiber 130 is converted into collimated light by the collimator lens 107A, and is incident on the optical demultiplexing circuit 105. The light (optical signal) incident from the optical fiber 130 is a wavelength multiplexed transmission signal. The optical demultiplexing circuit 105 includes optical components such as a demultiplexer, a mirror, and an optical filter. The light (wavelength multiplexed transmission signal) incident on the optical demultiplexing circuit 105 is divided into four-channel light rays (single wavelength signals), and each light ray is incident on the corresponding lens 124 of the microlens array 104.

Figure 3:
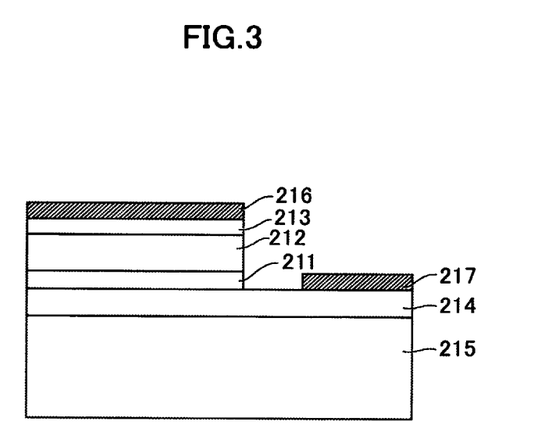
FIG. 3 is a schematic diagram of a photodiode according to the first embodiment of the present invention.

FIG. 3 is a schematic diagram of the photodiode 200 according to the first embodiment. The photodiodes 200 according to the first embodiment is a back-illuminated semiconductor photodiode, and FIG. 3 is a schematic cross-sectional view showing the configuration thereof.

An n-type InP contact layer 214 having a thickness of 1 μm which is doped with Si having a doping concentration of $5\times10^{18}/cm^3$, an undoped InGaAs absorption layer 211 having a thickness of Wd, a p-type InGaAs absorption layer 212 having a thickness of Wp which is incrementally doped with Be from a doping concentration of $5\times10^{17}/cm^3$ to a doping concentration of $1\times10^{18}/cm^3$ in a layered direction, and a p-type InGaAs contact layer 213 having a thickness of 0.1 μm which is doped with Be having a doping concentration of $5\times10^{19}/cm^3$ are layered on a semi-insulating InP substrate 215 which is doped with Fe.

A light absorption layer is disposed between the p-type InGaAs contact layer 213 and the n-type InP contact layer 214, and includes the undoped InGaAs absorption layer 211 and the p-type InGaAs absorption layer 212. The undoped InGaAs absorption layer 211 is a first semiconductor absorption layer which is disposed on a side of the n-type InP contact layer 214 and is not intentionally doped with impurities (additive: dopants). The p-type InGaAs absorption layer 212 is a second semiconductor absorption layer which is in contact with the undoped InGaAs absorption layer 211, is disposed on a side of the p-type InGaAs contact layer 213, and is doped in a p-type.

The undoped InGaAs absorption layer 211 and the p-type InGaAs absorption layer 212 are made of the same composition (InGaAs). In this specification, the same composition means that base materials constituting the semiconductor layers are the same, and impurities (additive: dopants) may be different. In the first embodiment, both the first semiconductor absorption layer and the second semiconductor absorption layer are made of InGaAs. InGaAs means $In_xGa_{1-x}As$, and the first semiconductor absorption layer and the second semiconductor absorption layer have the same compositions even though values of x of the first semiconductor absorption layer and the second semiconductor absorption layer are different. However, the value of x is in a range of 0<x<1, and the first semiconductor absorption layer and the second semiconductor absorption layer are not regarded as having the same composition as the composition of InGaAs in both cases of x=0 (GaAs) and x=1 (InAs). This example shows a case where group III includes a plurality of elements, and is true of a case where group V includes a plurality of elements or a case where each of group III and group V includes a plurality of elements.

The undoped InGaAs absorption layer 211, the p-type InGaAs absorption layer 212, and the p-type InGaAs contact layer 213 are etched in a cylindrical shape having a diameter of 10 μm, and constitute a light receiving mesa portion. A p-type electrode 216 is connected to the p-type InGaAs contact layer 213, and an n-type electrode 217 is connected to the n-type InP contact layer 214. The undoped InGaAs absorption layer 211, the p-type InGaAs absorption layer 212, and the p-type InGaAs contact layer 213 are lattice-matched to the semi-insulating InP substrate 215.

Figure 4:
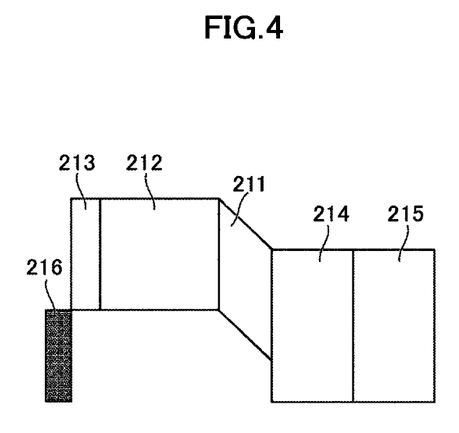
FIG. 4 is a band diagram of the photodiode according to the first embodiment of the present invention.

FIG. 4 is a band diagram of the photodiode 200 according to the first embodiment. The first semiconductor absorption layer (the undoped InGaAs absorption layer 211) has band-gap energy in which the input light is absorbed. The doping concentration of the second semiconductor absorption layer (the p-type InGaAs absorption layer 212) is a doping concentration lower than the doping concentrations of the p-type semiconductor absorption layer (the p-type InGaAs contact layer 213) and the n-type semiconductor contact layer 214. The doping concentration of the first semiconductor absorption layer is lower than the doping concentration of the second semiconductor absorption layer. Particularly, the first semiconductor absorption layer according to the first embodiment is the undoped semiconductor layer. In this specification, the term of "undoped" means that the impurities (additive: dopants) are not intentionally doped, and particularly means that a doping concentration of the impurities is equal to or lower than $1 \times 10^{16}/cm^3$. Although the doping concentration of the second semiconductor absorption layer according to the first embodiment incrementally increases in the layered direction as described above, the present invention is not limited thereto. The doping concentration on an upper surface of the second semiconductor absorption layer is lower than the doping concentration of the p-type semiconductor contact layer, and the doping concentration on a lower surface of the second semiconductor absorption layer is higher than the doping concentration of the first semiconductor absorption layer.

A predetermined reverse bias voltage is applied between the p-type InGaAs contact layer 213 and the n-type InP contact layer 214 at the time of the operation of the photodiode 200. In such a case, the photodiode is designed such that the first semiconductor absorption layer is depleted and the second semiconductor absorption layer maintains an electric charge neutral condition except for a region near an interface with the first semiconductor absorption layer. Both the first semiconductor absorption layer (the undoped InGaAs absorption layer 211) and the second semiconductor absorption layer (the p-type InGaAs absorption layer 212) act as a light absorption layer which absorbs signal light having a wavelength of 1310 nm incident from a rear surface of the semi-insulating InP substrate 215.

A main feature of the semiconductor photodiode according to the present invention is that the relationship between the thickness Wd of the first semiconductor absorption layer and the thickness Wp of the second semiconductor absorption layer satisfies $0.47 \leq Wp/(Wd+Wp) \leq 0.9$. Particularly, in the semiconductor photodiode according to the first embodiment, it is further preferable that the first semiconductor absorption layer is in contact with the n-type semiconductor contact layer, the second semiconductor absorption layer is in contact with the p-type semiconductor contact layer, and the relationship between the thickness Wd and the thickness Wp satisfies $0.47 \leq Wp/(Wd+Wp) \leq 0.85$. The first semiconductor absorption layer according to the first embodiment is the undoped semiconductor layer, but may be a (p-type or n-type) semiconductor layer of which a doping concentration is lower than the doping concentration of the second semiconductor absorption layer. At the time of forming the undoped semiconductor layer, there are some cases where the first semiconductor absorption layer has a background impurity concentration by a crystal growth condition. In order to cancel the impurity concentration, a case where impurities having opposite polarities are intentionally added (doped) and the impurity concentration of the first semiconductor absorption layer is controlled is considered. In order to realize an optical receiver module 100 having a baud rate of 50 Gbit/s class, it is preferable that f3 dB is equal to or higher than 40 GHz. A case where the first semiconductor absorption layer and the second semiconductor absorption layer have the range of Wp/(Wd+Wp) is suitable for the optical receiver module 100 having the baud rate of 50 Gbit/s class.

In the first embodiment, a total thickness W (=Wd+Wp) of the undoped InGaAs absorption layer 211 and the p-type InGaAs absorption layer 212 is 1 μm. The light receiving sensitivity is 0.86 A/W, and a forward resistance is 10Ω.

The present invention has been made by the inventors by using a drift velocity ($V_h$) of holes of the first semiconductor absorption layer as a function of electric field intensity without being constant (saturation velocity) with consideration for an internal field effect occurring between holes generated in the first semiconductor absorption layer and electrons generated in the second semiconductor absorption layer. A range of a Wp/(Wd+Wp) as a ratio of the second semiconductor absorption layer for further increasing a response rate while maintaining the light receiving sensitivity at a constant level is found by a new calculation method based on such knowledge. Such a range is different from the ranges described in Patent Literature 1 and Non-Patent Literature 1.

Initially, the related art will be described. Non-Patent Literature 1 discloses a photodiode having a structure in which the total thickness W of the light absorption layer is 1 μm (=Wd+Wp) similarly to the photodiode 200 according to the first embodiment. Non-Patent Literature 1 shows a calculation result of a 3 dB cutoff frequency (f3 dB) in a case where Wp is changed from 0 to 1 μm, that is, Wp/(Wd+Wp) is changed from 0% to 100% while maintaining a condition in which the total thickness W of the undoped InGaAs absorption layer and the p-type InGaAs absorption layer is 1 μm. In a case where Wp=0.35 μm, that is, Wp/(Wd+Wp)=35%, f3 dB becomes maximum, and about 40 GHz is obtained. In Non-Patent Literature 1, as Wp/(Wd+Wp) decreases, that is, the thickness Wd of the undoped InGaAs absorption layer increases, a carrier transit time $\tau_D$ due to the holes within the undoped InGaAs absorption layer increases. In contrast, as Wp/(Wd+Wp) increases, that is, the thickness Wp of the p-type InGaAs absorption layer increases, a carrier transit time $\tau_A$ due to the electrons within the p-type InGaAs absorption layer increases. Thus, a carrier transit time $\tau_{tot}$ of an effective entire light absorption layer that restricts a bandwidth becomes minimum in a case where Wp/(Wd+Wp) is about 35%.

However, the calculation methods of the related arts according to Patent Literature 1 and Non-Patent Literature 1 have the following problems. Firstly, it is assumed that the electron generated within the p-type absorption layer drifts toward the undoped absorption layer through diffusion. In contrast, the internal field effect occurring between holes remaining within the doped absorption layer and electrons of the p-type absorption layer is considered in the present invention. Secondly, it is assumed that the drift velocity $V_h$ of the holes of the undoped absorption layer is a constant value (saturation velocity). In contrast, the drift velocity of the hole of the undoped absorption layer is used as the function of electric field intensity in the present invention.

Figure 5:
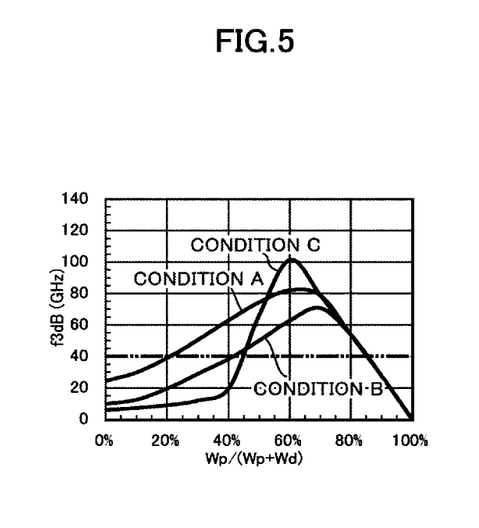
FIG. 5 is a diagram showing calculation results of a 3 dB cutoff frequency of the photodiode according to the first embodiment of the present invention.

FIG. 5 is a diagram showing calculation results of a 3 dB cutoff frequency of the photodiode 200 according to the first embodiment. In FIG. 5, a horizontal axis represents Wp/(Wd+Wp), and a vertical axis represents the 3 dB cutoff frequency (f3 dB). FIG. 5 shows the calculation results of f3 dB at various values of Wp/(Wd+Wp) in a case where the total thickness W (=Wd+Wp) of the first semiconductor absorption layer and the second semiconductor absorption layer is 1 μm (constant) under three conditions (Conditions A to C) to be described below.

Condition A is a condition in which a reverse bias voltage Vr is 5V as high bias, optical signal input intensity Pin is 0 dBm, and a diameter w of the optical signal in the light absorption layer (the undoped InGaAs absorption layer 211 and the p-type InGaAs absorption layer 212) is 8 μm. A curve line indicated by Condition A in FIG. 5 is the calculation result calculated under Condition A. In Condition A, f3 dB>40 GHz in a wide range in which Wp/(Wd+Wp) is 20 to 85%. f3 dB having 50 GHz or more is also obtained in 35% represented in Non-Patent Literature 1.

However, in a case where an operation using a single power supply having 3.3 V is assumed, there is a concern that a voltage between the terminals of the photodiode 200 will be decreased to about 1.5 V at the minimum. An internal electric field intensity occurring between the holes generated in the undoped InGaAs absorption layer 211 and the electrons generated in the p-type InGaAs absorption layer 212 tends to be increased as a peak value of optical signal intensity within the light absorption layer becomes larger, that is, the optical signal input intensity becomes higher, and as the diameter of the optical signal in the light absorption layer becomes smaller. There is a possibility that the optical signal input intensity will fluctuate from −12 dBm to 5 dBm by optical signal output intensity of a light source or a transmission distance. There is a possibility that the diameter of the optical signal in the light absorption layer will fluctuate from 3 μm to 10 μm by the optical system of the optical receiver module 100.

Condition B is a condition in which the reverse bias voltage Vr is 1.5 V as low bias, the optical signal input intensity Pin is 5 dBm, the diameter ω of the optical signal in the light absorption layer is 10 μm, and the peak value of the optical signal intensity within the light absorption layer is small. A curve line indicated by Condition B in FIG. 5 is the calculation result calculated under Condition B. In Condition B, f3 dB>40 GHz in a range in which Wp/(Wd+Wp) is 42 to 85%.

Condition C is a condition in which the reverse bias voltage Vr is 1.5 V as low bias, the optical signal input intensity Pin is −12 dBm, the diameter ω of the optical signal in the light absorption layer is 3 μm, and the peak value of the optical signal intensity within the light absorption layer is large. A curve line indicated by Condition C in FIG. 5 is the calculation result calculated under Condition C. In Condition C, f3 dB>40 GHz in a range in which Wp/(Wd+Wp) is 47 to 85%. Thus, all Conditions A to C are satisfied in a range in which Wp/(Wd+Wp) is 47 to 85%, and f3 dB>40 GHz in this range. It is preferable that f3 dB>50 GHz in order to perform even more stable high-speed operation, and all Conditions A to C are satisfied in a range in which Wp/(Wd+Wp) is equal to or larger than 48% and is equal to or smaller than 82%.

The reason why the value of f3 dB is decreased in a case where Wp/(Wd+Wp) is equal to or smaller 70% in Condition B and is equal to or smaller than 60% in Condition C is that the electric field intensity is decreased due to an increase in thickness of the undoped InGaAs absorption layer 211 and the carrier transit time $\tau_D$ of the holes is increased. The reason why the value of f3 dB is decreased in a case where Wp/(Wd+Wp) is equal to or larger than 70% in Condition B and is equal to or larger than 60% in Condition C is that a CR time constant increases with an increase in capacitance.

The photodiode 200 satisfying that Wp/(Wd+Wp)=60%, that is, Wp=0.6 μm and Wd=0.4 μm is manufactured, and the optical receiver module 100 which has the photodiode 200 mounted thereon and includes a single power supply circuit having 3.3 V is provided. In this optical receiver module, an effect of an increase in CR time constant caused by parasitic capacitance of about 20 fF due to the mount is acquired, and f3 dB having about 40 GHz is acquired in a desired range of optical signal intensity. In the optical receiver module 100 including the single power supply circuit having 3.3 V, it is considered that the predetermined reverse bias voltage between the p-type InGaAs contact layer 213 and the n-type InP contact layer 214 of the photodiode 200 is 1.5 V to 2.5V. It is preferable that a response rate is further increased in a case where such a reverse bias voltage is applied.

Second Embodiment

Figure 6:
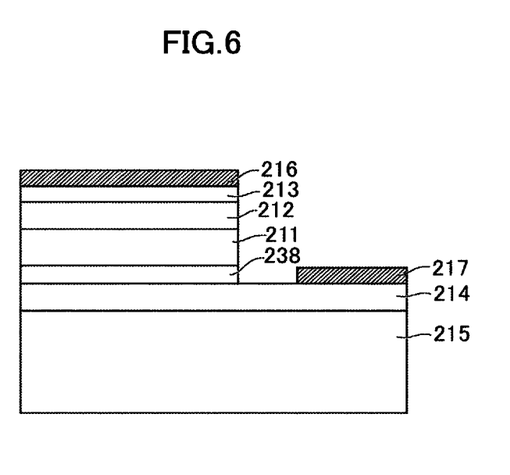
FIG. 6 is a schematic diagram of a photodiode according to a second embodiment of the present invention.

FIG. 6 is a schematic diagram of a photodiode 230 according to a second embodiment of the present invention. The photodiode 230 according to the second embodiment is a back-illuminated semiconductor photodiode, and FIG. 6 is a cross-sectional view showing the configuration thereof. The photodiode 230 according to the second embodiment is different from the first embodiment in that an undoped InAlGaAs electron transit layer 238 disposed between the first semiconductor absorption layer (the undoped InGaAs absorption layer 211) and the n-type semiconductor contact layer (the n-type InP contact layer 214) is further included in a semiconductor multilayer structure, and has the same structure as the structure of the first embodiment except for the aforementioned difference.

An n-type InP contact layer 214 having a thickness of 1 μm which is doped with Si having a doping concentration of $5\times10^{18}/cm^3$, an undoped InAlGaAs electron transit layer 238 having a thickness Wt in a bandgap wavelength of 1.2 μm, an undoped InGaAs absorption layer 211 having a thickness of Wd, a p-type InGaAs absorption layer 212 having a thickness of Wp which is incrementally doped with Be from a doping concentration of $5\times10^{17}/cm^3$ to a doping concentration of $1\times10^{18}/cm^3$ in a layered direction, and a p-type InGaAs contact layer 213 having a thickness of 0.1 μm which is doped with Be having a doping concentration of $5\times10^{19}/cm^3$ are layered on a semi-insulating InP substrate 215 which is doped with Fe.

Figure 7:
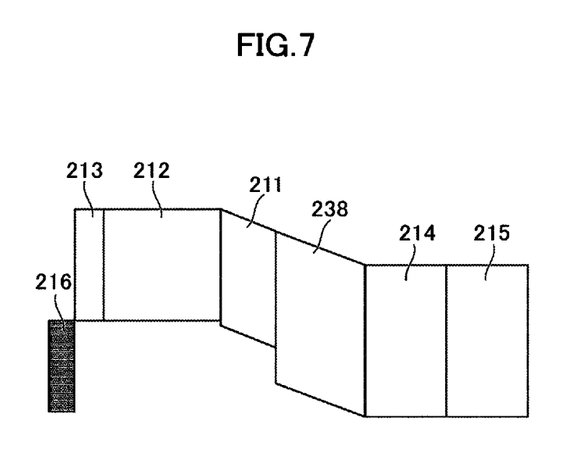
FIG. 7 is a band diagram of the photodiode according to the second embodiment of the present invention.

FIG. 7 is a band diagram of the photodiode 230 according to the second embodiment. Bandgap energy of the undoped InAlGaAs electron transit layer 238 is bandgap energy which is higher than the bandgap energy in which the input light is absorbed and does not function as a light absorption layer. At the time of the operation of the photodiode 230, a predetermined reverse bias voltage is applied between the p-type InGaAs contact layer 213 and the n-type InP contact layer 214. In such a case, the photodiode is designed such that the undoped InGaAs absorption layer 211 which is the first semiconductor absorption layer and the undoped InAlGaAs electron transit layer 238 are depleted and the p-type InGaAs absorption layer 212 which is the second semiconductor absorption layer maintains an electric charge neutral condition except for a region near an interface with the undoped InGaAs absorption layer 211. Both the undoped InGaAs absorption layer 211 and the p-type InGaAs absorption layer 212 act as the light absorption layer that absorbs the signal light having the wavelength of 1310 nm incident from the rear surface of the semi-insulating InP substrate 215, and the undoped InAlGaAs electron transit layer 238 does not absorbs the signal light having the wavelength of 1310 nm.

The total thickness W of the undoped InGaAs absorption layer 211 and the p-type InGaAs absorption layer 212 is 1 μm (=Wd+Wp), and a total thickness W2 of the undoped InGaAs absorption layer 211 and the undoped InAlGaAs electron transit layer 238 is 0.6 μm (=Wd+Wt). The light receiving sensitivity is 0.86 A/W, and a forward resistance is 10Ω. A capacitance of the light receiving mesa portion of the photodiode 230 is about 16 fF.

Figure 8:
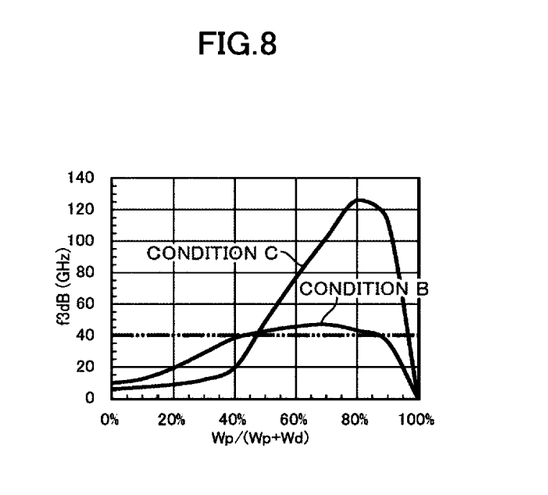
FIG. 8 is a diagram showing calculation results of a 3 dB cutoff frequency of the photodiode according to the second embodiment of the present invention.

FIG. 8 is a diagram showing calculation results of a 3 dB cutoff frequency of the photodiode 230 according to the second embodiment. FIG. 8 corresponds to FIG. 5 according to the first embodiment. The calculation results of f3 dB at various values of Wp/(Wd+Wp) in a case where the total thickness W (=Wd+Wp) of the undoped InGaAs absorption layer 211 and the p-type InGaAs absorption layer 212 is 1 μm (constant) and the total thickness W2 (=Wd+Wt) of the undoped InGaAs absorption layer 211 and the undoped InAlGaAs electron transit layer 238 is 0.6 μm (constant) under two conditions (Conditions B and C). In this case, Wt is fixed as 0 μm in a case where Wp/(Wp+Wd)≤40%, that is, Wp≥0.4 μm and Wd≤0.6≤m.

A curve line indicated by Condition B in FIG. 8 is the calculation result calculated under Condition B, and f3 dB>40 GHz in a range in which Wp/(Wd+Wp) is 45 to 88% in Condition B. A curve line indicated by Condition C in FIG. 8 is the calculation result calculated under Condition C, and f3 dB>40 GHz in a range in which Wp/(Wd+Wp) is 50 to 95% in Condition C.

As compared with the first embodiment, a range of Wp/(Wd+Wp) in which f3 dB>40 GHz is shifted toward a large value. Particularly, the reason why f3 dB is high in a range of 80% or more is that the thickness W2 of the depletion layer is constant at 0.6 μm and the capacitance is constant at about 16 fF by further disposing the undoped InAlGaAs electron transit layer 238 and a decrease in bandwidth restricted by the CR time constant is suppressed.

The main feature of the semiconductor photodiode according to the second embodiment is that the relationship between the thickness Wd of the first semiconductor absorption layer and the thickness Wp of the second semiconductor absorption layer satisfies 0.5≤Wp/(Wp+Wd)≤0.88. Particularly, in the semiconductor photodiode according to the second embodiment, the first semiconductor absorption layer is in contact with the semiconductor electron transit layer, the semiconductor electron transit layer is in contact with the n-type semiconductor contact layer, and the second semiconductor absorption layer is in contact with the p-type semiconductor contact layer. The semiconductor electron transit layer according to the second embodiment is the undoped semiconductor layer, but may be a (p-type or n-type) semiconductor layer having a doping concentration equal to or lower than the doping concentration of the first semiconductor absorption layer.

The photodiode 230 satisfying that Wp/(Wd+Wp)=70%, that is, Wp=0.7 μm, Wd=0.3 μm, and Wt=0.3 μm is manufactured, the optical receiver module 100 which has the photodiode 230 mounted thereon and includes a single power supply circuit having 3.3 V is provided. In this optical receiver module, an effect of an increase in CR time constant caused by parasitic capacitance of about 20 fF due to the mount is acquired, and f3 dB having about 47 GHz is acquired in a desired range of optical signal intensity.

The semiconductor photodiode, the optical receiver module, the optical module, the optical transmission equipment, and the optical transmission system according to the embodiments of the present invention have been described. The present invention is not limited to the aforementioned embodiments, and can be modified in various manners. The present invention can be applied in wide ranges. The configurations described in the aforementioned embodiments can be replaced with the substantially same configuration, a configuration exhibiting the same advantageous effects, or a configuration capable of achieving the same object.

Figure 9:
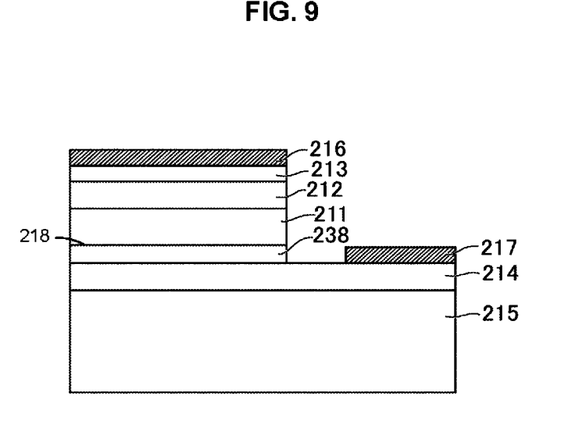
FIG. 9 is a schematic diagram of a photodiode according to a third embodiment of the present invention.

Although it has been described that the photodiode 230 according to the second embodiment has the semiconductor structure in which the undoped InAlGaAs electron transit layer 238 is in contact with the undoped InGaAs absorption layer 211, the present invention is not limited thereto. The photodiode 230 may further include a semiconductor field control layer 218 disposed between the undoped InGaAs absorption layer 211 and the undoped InAlGaAs electron transit layer 238 according to a third embodiment of the present invention. In this example, impurities having a doping concentration higher than both the doping concentration of the undoped InGaAs absorption layer 211 and the doping concentration of the undoped InAlGaAs electron transit layer 238 are added (doped) to the semiconductor field control layer 218. An upper surface of the semiconductor field control layer 218 may be in contact with the undoped InGaAs absorption layer 211, and a lower surface thereof may be in contact with the undoped InAlGaAs electron transit layer 238. The doping concentration of the semiconductor field control layer 218 is controlled such that a voltage to be applied is appropriately distributed to the undoped InGaAs absorption layer 211 and the undoped InAlGaAs electron transit layer 239.

Although it has been described in the aforementioned embodiments that both the first semiconductor absorption layer and the second semiconductor absorption layer are made of InGaAs, the present invention is not limited thereto. Both the first semiconductor absorption layer and the second semiconductor absorption layer may be made of one composition selected from a group consisting of InGaAs, InGaAsP, and InAlGaAs. Although it has been described in the second embodiment that the semiconductor electron transit layer is made of InAlGaAs, the present invention is not limited thereto. For example, the semiconductor electron transit layer may be made of InP or may be made of InGaAsP.

As described above, in the semiconductor photodiode having the absorption layer formed in the two-layer structure including the undoped absorption layer and the p-type absorption layer, it is known in the related art that the ratio of the thickness of the undoped absorption layer is increased and the f3 dB bandwidth can be consequently increased, whereas the present invention has found for the first time that the ratio of the thickness of the p-type absorption layer is increased by establishing a new calculation model and the bandwidth is consequently improved.

Although it has been described in the aforementioned embodiments that the four-channel microlens array 104 is used, the present invention is not limited thereto. The microlens array may have other number of channels or may have a single channel. Although it has been described that the semiconductor photodiodes according to the aforementioned embodiments are the pin photodiodes, the present invention is not limited thereto. The semiconductor photodiode may be other semiconductor photodiodes as long as the semiconductor photodiode has the semiconductor structure according to the present invention. Although the wavelength of the signal light input to the semiconductor photodiode according to the aforementioned embodiments is 1310 nm, the present invention is not limited thereto. For example, the present invention is applicable to a band of 1550 nm.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A semiconductor photodiode comprising:
a p-type electrode;
a p-type semiconductor contact layer connected to the p-type electrode;
an n-type electrode;
an n-type semiconductor contact layer connected to the n-type electrode; and
a light absorption layer disposed between the p-type semiconductor contact layer and the n-type semiconductor contact layer,
wherein the light absorption layer includes:
a first semiconductor absorption layer which is disposed on a side of the n-type semiconductor contact layer and has a thickness Wd; and
a second semiconductor absorption layer which is in contact with the first semiconductor absorption layer, is disposed on a side of the p-type semiconductor contact layer, has a thickness Wp, and is doped p-type,
wherein the first semiconductor absorption layer and the second semiconductor absorption layer are made of a same composition,
wherein the first semiconductor absorption layer has bandgap energy in which input light is absorbed,
wherein, when a predetermined reverse bias voltage is applied between the p-type electrode and the n-type electrode:
the first semiconductor absorption layer is depleted; and
the second semiconductor absorption layer maintains an electric charge neutral condition except for a region near an interface with the first semiconductor absorption layer,
wherein the region near the interface with the first semiconductor absorption layer does not maintain the electric charge neutral condition; and
wherein a relationship between the thickness Wd and the thickness Wp satisfies $0.47 \leq Wp/(Wp+Wd) \leq 0.9$.

2. The semiconductor photodiode according to claim 1, wherein the first semiconductor absorption layer is in contact with the n-type semiconductor contact layer,
wherein the second semiconductor absorption layer is in contact with the p-type semiconductor contact layer, and
wherein the relationship between the thickness Wd and the thickness Wp satisfies $0.47 \leq Wp/(Wp+Wd) \leq 0.85$.

3. The semiconductor photodiode according to claim 1, further comprising:
a semiconductor electron transit layer disposed between the first semiconductor absorption layer and the n-type semiconductor contact layer,
wherein the semiconductor electron transit layer has bandgap energy which is higher than the bandgap energy in which the input light is absorbed and does not function as the light absorption layer,
wherein, when the predetermined reverse bias voltage is applied between the p-type electrode and the n-type electrode, the semiconductor electron transit layer is depleted, and
wherein the relationship between the thickness Wd and the thickness Wp satisfies $0.5 \leq Wp/(Wp+Wd) \leq 0.88$.

4. The semiconductor photodiode according to claim 3, further comprising:
a semiconductor field control layer which is disposed between the first semiconductor absorption layer and the semiconductor electron transit layer and to which impurities having a doping concentration higher than both a doping concentration of the first semiconductor absorption layer and a doping concentration of the semiconductor electron transit layer are added.

5. The semiconductor photodiode according to claim 1, wherein each of the p-type semiconductor contact layer, the n-type semiconductor contact layer, the first semiconductor absorption layer, and the second semiconductor absorption layer are constituted by one or materials from group III and/or one or more materials from group V.

6. The semiconductor photodiode according to claim 1, wherein both the first semiconductor absorption layer and the second semiconductor absorption layer are made of one composition selected from a group consisting of InGaAs, InGaAsP, and InAlGaAs.

7. An optical receiver module comprising:
the semiconductor photodiode according to claim 1.

8. An optical module comprising:
the optical receiver module according to claim 7; and
an optical transmitter module.

9. An optical transmission equipment having the optical module according to claim 8 mounted thereon.

10. A photo detector device comprising:
a photodiode comprising:
a p-type electrode;
an n-type electrode; and
a light absorption layer disposed between a p-type semiconductor contact layer and a n-type semiconductor contact layer,
wherein the light absorption layer includes:
a first semiconductor absorption layer which is disposed on a side of the n-type semiconductor contact layer; and
a second semiconductor absorption layer which is in contact with the first semiconductor absorption layer, is disposed on a side of the p-type semiconductor contact layer, and is doped p-type,
wherein the first semiconductor absorption layer has bandgap energy in which input light is absorbed, and
wherein, when a predetermined reverse bias voltage is applied between the p-type electrode and the n-type electrode:
the first semiconductor absorption layer is depleted; and
the second semiconductor absorption layer maintains an electric charge neutral condition except for a region near an interface with the first semiconductor absorption layer,
wherein the region near the interface with the first semiconductor absorption layer does not maintain the electric charge neutral condition.

11. The photo detector device of claim 10, wherein a ratio of a thickness of the second semiconductor absorption layer to a thickness of the light absorption layer satisfies being:
greater than or equal to 0.47; and
less than or equal to 0.9.

12. The photo detector device of claim 10, wherein the first semiconductor absorption layer is in contact with the n-type semiconductor contact layer, and
wherein the second semiconductor absorption layer is in contact with the p-type semiconductor contact layer.

13. The photo detector device of claim 10, wherein a doping concentration on an upper surface of the second semiconductor absorption layer is lower than a doping concentration of the p-type semiconductor contact layer, and a doping concentration on a lower surface of the second semiconductor absorption layer is higher than a doping concentration of the first semiconductor absorption layer.

14. The photo detector device of claim 10, further comprising:
a semiconductor electron transit layer disposed between the first semiconductor absorption layer and the n-type semiconductor contact layer,
wherein the semiconductor electron transit layer has bandgap energy which is higher than the bandgap energy in which the input light is absorbed and does not function as the light absorption layer, and
wherein, when the predetermined reverse bias voltage is applied between the p-type electrode and the n-type electrode, the semiconductor electron transit layer is depleted.

15. The photo detector device of claim 14, further comprising:
a semiconductor field control layer which is disposed between the first semiconductor absorption layer and the semiconductor electron transit layer and to which impurities having a doping concentration higher than both a doping concentration of the first semiconductor absorption layer and a doping concentration of the semiconductor electron transit layer are added.

16. The photo detector device of claim 10, wherein each of the p-type semiconductor contact layer, the n-type semiconductor contact layer, the first semiconductor absorption layer, and the second semiconductor absorption layer are constituted by one or more materials from group III and/or one or more materials from group V.

17. The photo detector device of claim 10, wherein both the first semiconductor absorption layer and the second semiconductor absorption layer are made of one composition selected from a group consisting of InGaAs, InGaAsP, and InAlGaAs.

18. The photo detector device of claim 10, wherein the first semiconductor absorption layer is undoped.

19. A photodiode, comprising:
a p-type electrode;
a p-type semiconductor contact layer connected to the p-type electrode;
an n-type electrode;
a n-type semiconductor contact layer connected to the n-type electrode;
a light absorption layer disposed between the p-type semiconductor contact layer and the n-type semiconductor contact layer,
wherein the light absorption layer includes:
a first semiconductor absorption layer; and
a second semiconductor absorption layer disposed between the first semiconductor absorption layer and the p-type semiconductor contact layer,
wherein a ratio of a thickness of the second semiconductor absorption layer to a thickness of the light absorption layer satisfies being:
greater than or equal to 0.45; and
less than or equal to 0.95,
wherein the first semiconductor absorption layer has bandgap energy in which input light is absorbed, and
wherein a doping concentration on an upper surface of the second semiconductor absorption layer is lower than a doping concentration of the p-type semiconductor contact layer, and a doping concentration on a lower surface of the second semiconductor absorption layer is higher than a doping concentration of the first semiconductor absorption layer; and
a semiconductor electron transit layer disposed between the first semiconductor absorption layer and the n-type semiconductor contact layer,
wherein a total thickness of the semiconductor electron transit layer is less than a total thickness of the second semiconductor absorption layer.

20. The photodiode of claim 19, wherein, under a first condition, the ratio of the thickness of the second semiconductor absorption layer to the thickness of the light absorption layer satisfies being:
greater than or equal to 0.45, and
less than or equal to 0.88; and
wherein, under a second condition, the ratio of the thickness of the second semiconductor absorption layer to the thickness of the light absorption layer satisfies being:
greater than or equal to 0.50, and
less than or equal to 0.95.

* * * * *